US006768638B2

(12) United States Patent
Shih

(10) Patent No.: US 6,768,638 B2
(45) Date of Patent: Jul. 27, 2004

(54) SERVER CONTAINED FOUR JUXTAPOSED HARD DISK DRIVES

(76) Inventor: Shoei-Yuan Shih, No. 8, Lane 85, Hsing-I Rd., Pei-Tou Dist., Taipei (TW)

( * ) Notice: Subject to any disclaimer, the term of this patent is extended or adjusted under 35 U.S.C. 154(b) by 68 days.

(21) Appl. No.: 10/014,546

(22) Filed: Dec. 14, 2001

(65) Prior Publication Data

US 2003/0112596 A1 Jun. 19, 2003

(51) Int. Cl.$^7$ ................................................ H05K 7/00
(52) U.S. Cl. ....................................... 361/685; 361/695
(58) Field of Search ............................... 361/685, 687, 361/724–727, 695–696

(56) References Cited

U.S. PATENT DOCUMENTS

| 6,239,971 B1 | * | 5/2001 | Yu et al. | 361/695 |
| D445,761 S | * | 7/2001 | Weng | D13/110 |
| 6,392,884 B1 | * | 5/2002 | Chou | 361/687 |
| 6,421,239 B1 | * | 7/2002 | Huang | 361/696 |
| 2002/0089823 A1 | * | 7/2002 | Chin | 361/687 |

* cited by examiner

Primary Examiner—Hung Van Duong
(74) Attorney, Agent, or Firm—Birch, Stewart, Kolasch & Birch, LLP

(57) ABSTRACT

A server which is conformed to standard 1U server specifications has an inner width of 17 inches to house four sets of standard 3.5 inches hard disk drives in a juxtaposed manner. The server includes a casing which is divided in four housing spaces by three partitions. The partitions have improved features and a novel retrieval cradle is provided such that the server can accommodate required retrieval mechanisms for the hard disk drives thereby the hard disk drives may be housed in the casing smugly and are retrievable easily.

15 Claims, 8 Drawing Sheets

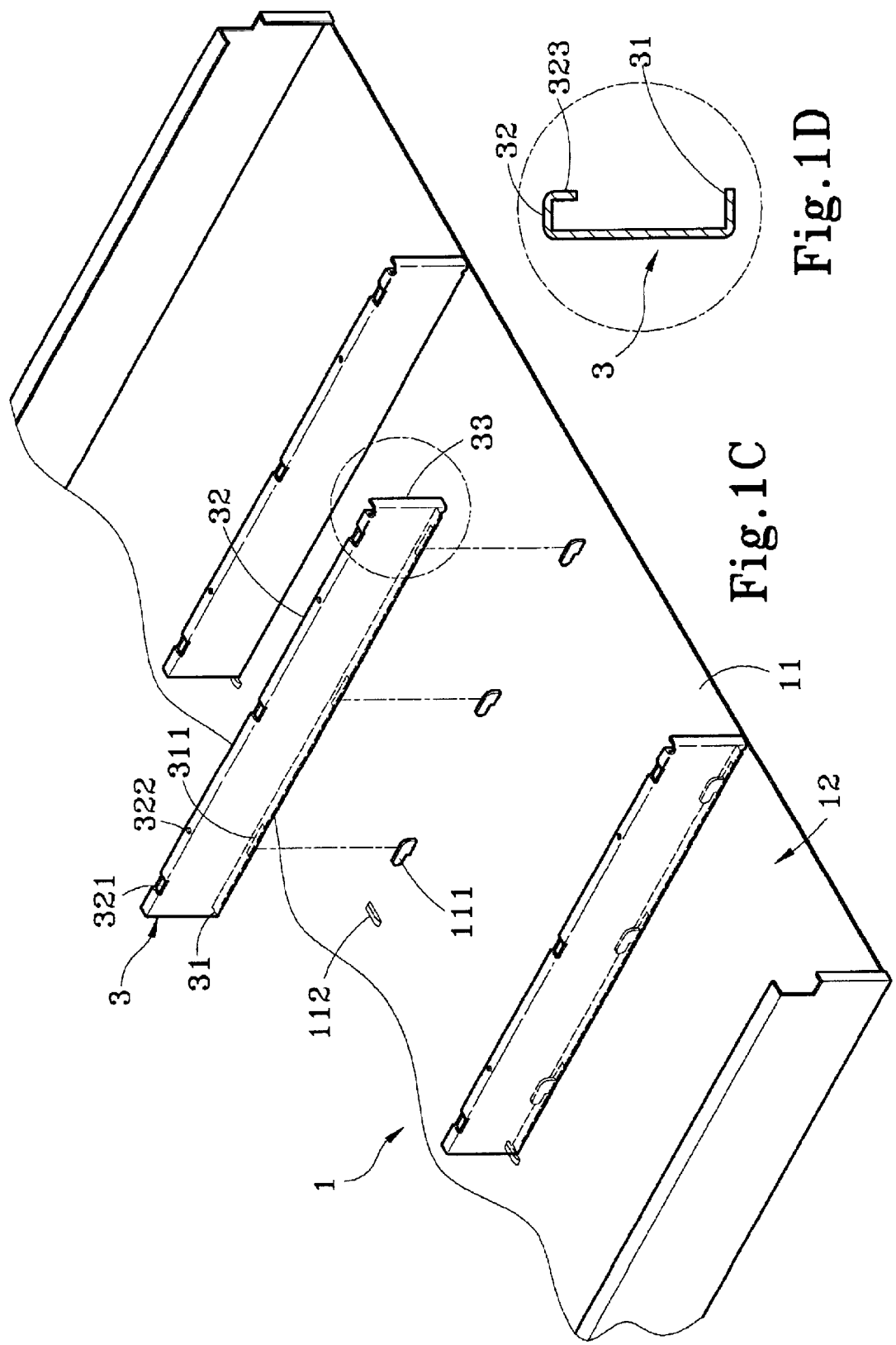

SERVER CONTAINED FOUR JUXTAPOSED HARD DISK DRIVES

FIELD OF THE INVENTION

The present invention relates to a server that contains four juxtaposed hard disk drives and particularly a server that conforms to industrial standard 1U19 inch specifications.

BACKGROUND OF THE INVENTION

The commonly used industrial servers are generally modularly configured for housing in a server cabinet with a width of 19 inches. There is an industry accepted common standard that defines a cubic dimension of 19×19×1.75 inches (for length×width×height) as a base unit which is generally called 1U server specification. This standard facilitates modular design and makes configuration more convenient. However the rapid development and progress of high speed networks in recent years create great demands for hard disk drive quantity in the server and motherboard and interface function. To meet these requirements, industry has developed more server specifications based on the 1U specifications, such as 2U server specifications that have the height of 3 inches, and 3U server specifications that have the height of 4.5 inches. There are even 4U and 5U server specifications that have even more housing space.

However there is also an increasing awareness in the industry that more server specifications such as 2U, 3U might help to increase housing apace for servers but does not always achieve more effective space utilization in the servers. It could even result in more space waste. The main problem is that server space utilization in the existing 1U specifications has reached a bottleneck. In the past, 1U server has an inner housing width of 17 inches (43.18 cm) and can accommodate maximum three sets of retrievable hard disk drives in a juxtaposed manner with a physical size of 4 inches (10.16 cm) wide to contain a hard disk drive of a standard width of 3.5 inches. Trying to accommodate four sets of retrievable hard disk drives in a juxtaposed manner in the 1U server cabinet has practical problem. As only one inch of space will be spared after four hard disk drives are housed in the server cabinet (17 in−4 in×4 in=1 in=2.54 cm), and to install the retrieval mechanism in an one inch space is very difficult.

The technology innovation in recent years has created new techniques that allow four sets of retrieval hard disk drives housed in a 1U server. In order to facilitate partition assembly and add slide rails, the partition is formed in a "I" shape. Such a design cannot be fitted into a cabinet inner space of 17 inches. Hence total cabinet width has to be increased to compensate the additional inner space required. Such a change affects the width of slide rails installed on two sides of the server cabinet, and the commonly used standard 10 mm steel ball slide rail cannot be used. As a result, special slide rails have to be made. It increases the cost and is not well accepted by consumers.

SUMMARY OF THE INVENTION

The primary object of the invention is resolve aforesaid disadvantages. The invention mainly utilizes an U-shaped partition to replace conventional I-shaped partition to reduce the width of single side. The casing has bent latch elements formed by punching to match latch slots formed on the partition to give the partition structure desired strength. The partitioned retrieval space contains a retrieval cradle which has single side board to save space. By means of the techniques provided by the invention, the server of 1U 19 inches specifications can house four retrievable hard disk drives of standard 3.5 inches in a juxtaposed manner.

Another object of the invention is to reduce the interval of two adjacent retrieval spaces through improved partition assembly method and retrieval cradle design so that the server of 1U specifications that has the inner width of 17 inches can concurrently accommodate four sets of retrievable hard disk drives.

A further object of the invention is to use partitions to divide four housing chambers for hard disk drives to contain retrieval cradles that are used to hold the retrievable hard disk drives, thereby the server inner space of 1U specifications can be fully utilized, and standard 10 mm steel ball slide rails can be used and installed on two sides of the server without the need of specially made slide rails.

Yet another object of the invention is to save the width of the retrieval slide rails for the hard disk drives and to reduce the height of the casing, and to include an additional partition on the hard disk for mounting super thin floppy disk drives and optical disk drives adopted to portable computers on the partition thereby to allow the server to equip full function.

The foregoing, as well as additional objects, features and advantages of the invention will be more readily apparent from the following detailed description, which proceeds with reference to the accompanying drawings.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A through 1E are perspective views of the invention.

DESCRIPTION OF THE PREFERRED EMBODIMENT

Figure 1A:
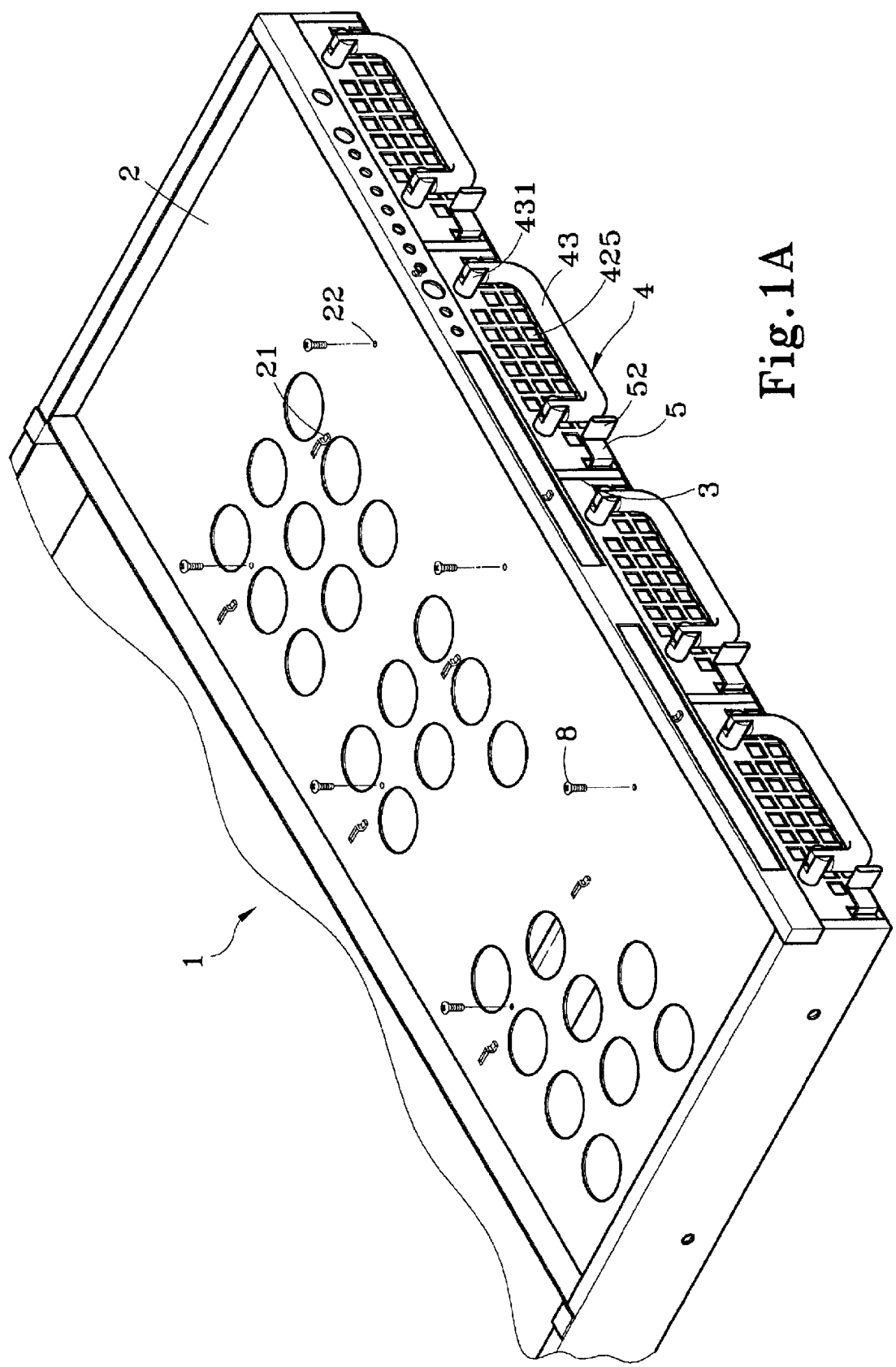
Figure 1B:
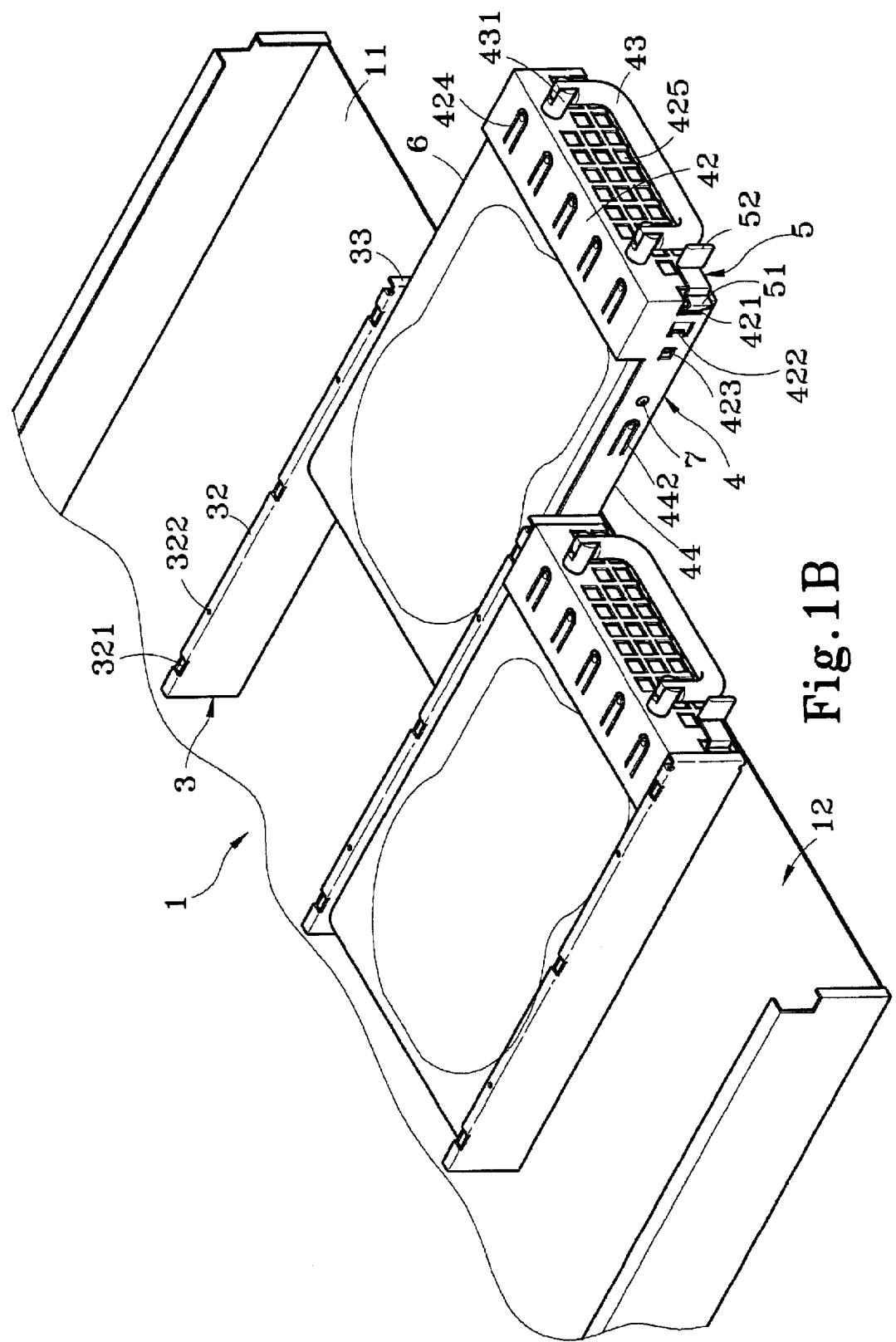
Figure 1E:
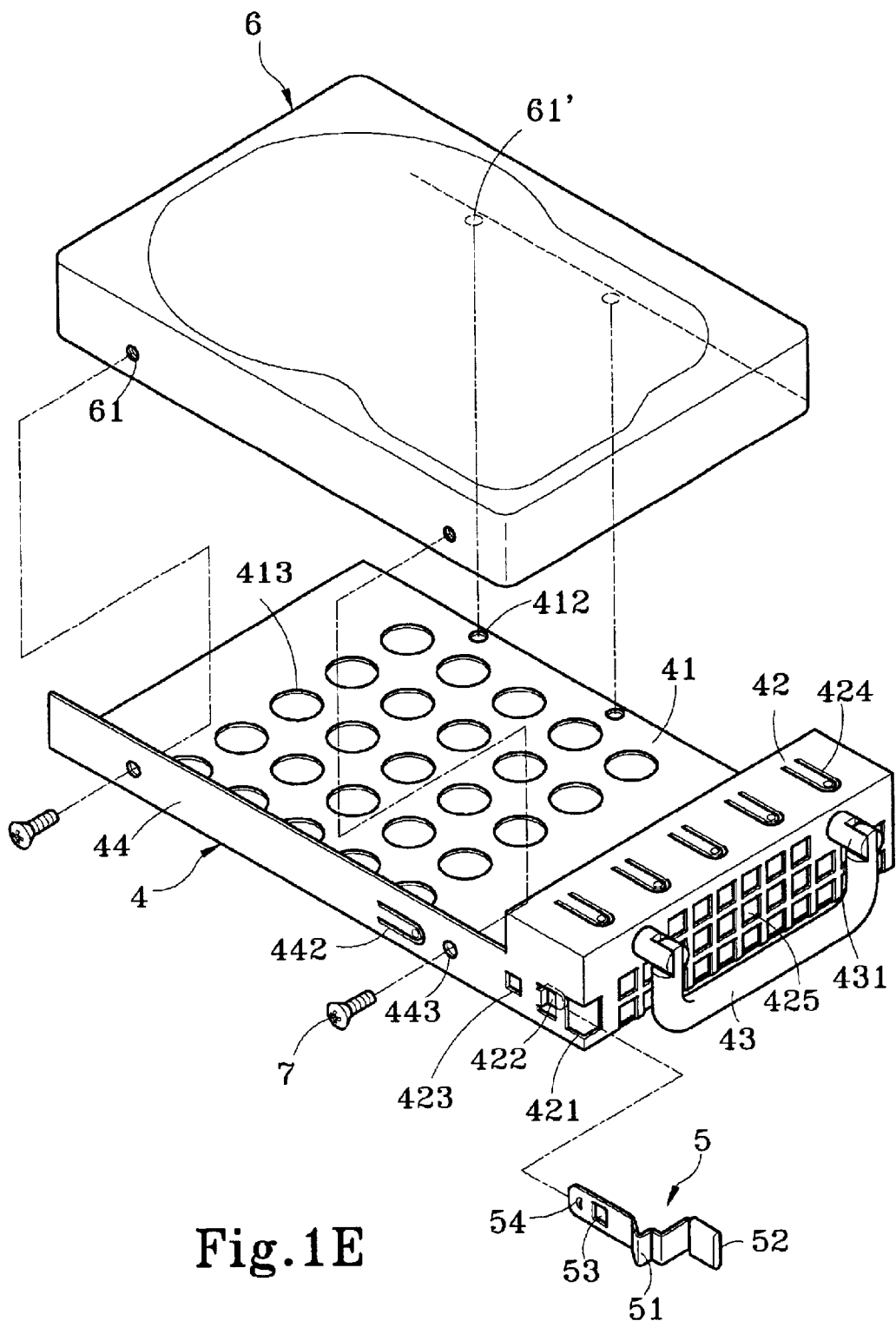

Referring to FIGS. 1A through 1E, the server according to the invention contains four sets of hard disk drives 6 laid in a juxtaposed manner. The server is conformed to 1U 19 inches specifications. And the hard disk drives 6 are retrievable from the server. The server has a casing 1 which includes a main partition 2, a bottom board 11 and three sets of secondary partitions 3 located between the main partition 2 and bottom board 11 to divide the casing in four retrieval spaces 12 for housing four sets of hard disk drives 6. Each retrieval space 12 contains a retrieval cradle 4 for holding a hard disk drive 6. The retrieval cradle 4 mainly includes a displacement board 41 and an anchor rack 42 located at the front end of the displacement board 41. On the anchor rack 42, there is a handle 43 to facilitate retrieving of the retrieval cradle 4. The retrieval cradle 4 further has a side board 44 formed by bending on one side of the displacement board 41. The displacement board 41 and side board 44 have respectively a plurality of fasten apertures 412 and 443 for fastening the hard disk drive 6. By means of the structure set forth above, four sets of standard 3.5 inches hard disk drives 6 may be housed in the 1U 19 inches server and may be retrieved individually and conveniently through the retrieval cradle 4.

During fabrication, in order to take into account of the strength of the secondary partitions 3 and space layout, the secondary partitions 3 are formed by punching a metal plate of 1 mm thickness. Each finished secondary partition 3 has a bent bottom end and a top end to respectively form a first anchor section 31 and a second anchor section 32 to fasten to the bottom board 11 and main partition 2. The second anchor section 32 further has a free end bent to form a reinforced section 323. The first anchor section 31 and second anchor section 32 also have respectively a first latch slot 311 and a second latch slot 321. The bottom board 11 and main partition 2 also have respectively a first latch element 111 and a second latch element 21 formed by punching to engage respectively with the first latch slot 311 and the second latch slot 321. Such a construction can greatly reduce the width of the secondary partitions 3. In addition, the top side of the secondary partition 3 and the main partition 2 have respectively first fasten aperture 22 and second fasten apertures 322 to engage with fasten elements 8 for anchoring the secondary partition 3. The bottom board 11 of the casing 1 further has a stopping ridge 112 corresponding to the rear end of the secondary partition 3 to confine the secondary partition 3 at a selected location.

The anchor rack 42 of the retrieval cradle 4 has a jutting strut 431 to pivotally engage with the handle 43. There is a brake elastic strip 5 located between one side of the anchor rack 42 and the front end of the secondary partition 3 to form a braking relationship therebetween. To achieve this purpose, the brake elastic strip 5 includes a jutting section 51, a depressing section 52 formed at a front free end thereof, a latch bore 53 and an anchor section 54. At the front end of one side of the anchor rack 42, there is an opening 421 for the brake elastic strip 5 to pass through, and a latch lug 422 and an anchor bore 423 to engage respectively with the latch bore 53 and anchor section 54 such that the brake elastic strip 5 may be directly riveted to the anchor rack 42. The front end of the secondary partition 3 further has a retain section 33 to harness the jutting section 51. The depressing section 52 is extended outside the opening 421 for relieving the brake relationship whenever desired.

The bent reinforced section 323 at the top end of the secondary partition 3 is adjacent to the side board 44 of the retrieval cradle 4 to increase structural strength so that the width of the partition and total width of the server can be reduced. The displacement board 41 and anchor rack 42 further have respectively a plurality of heat radiation openings 413 and 425 to facilitate air ventilation for dispersing heat generated by the hard disk drives 6 during operation. The anchor rack 42 and side board 44 adjacent to the casing 1 also have respectively a plurality of conductive strips 424, 442 formed by punching for linking to the server cabinet to avoid static charge.

Figure 2B:
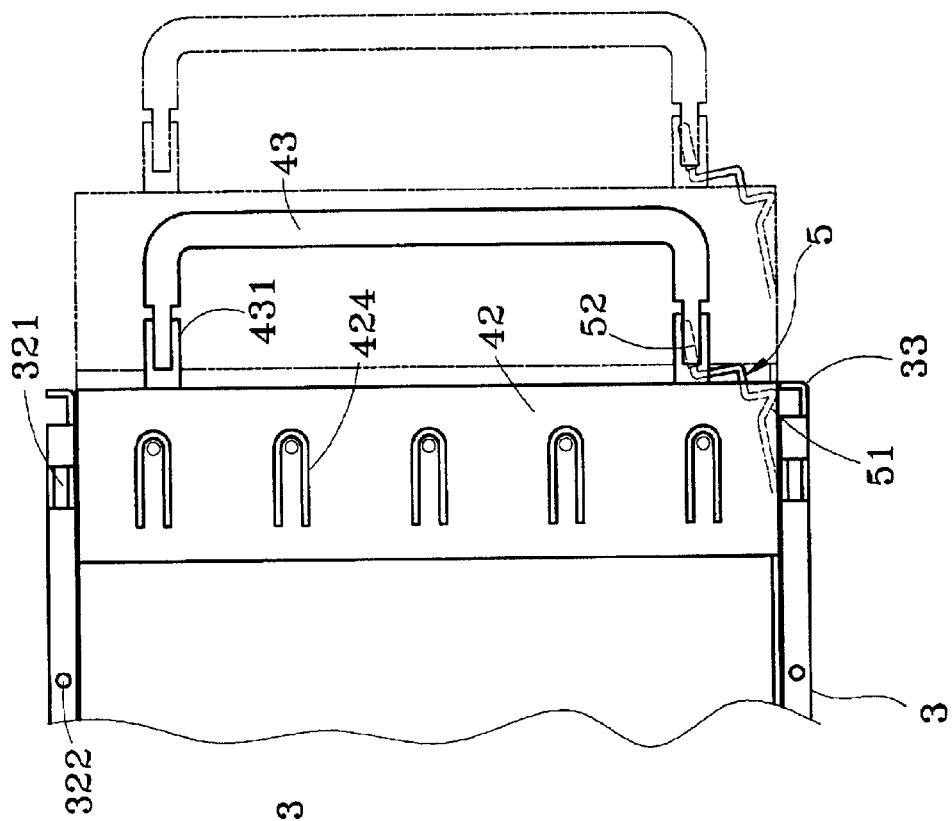
FIGS. 2A and 2B are schematic views of a retrieval cradle under operation.
Figure 2A:
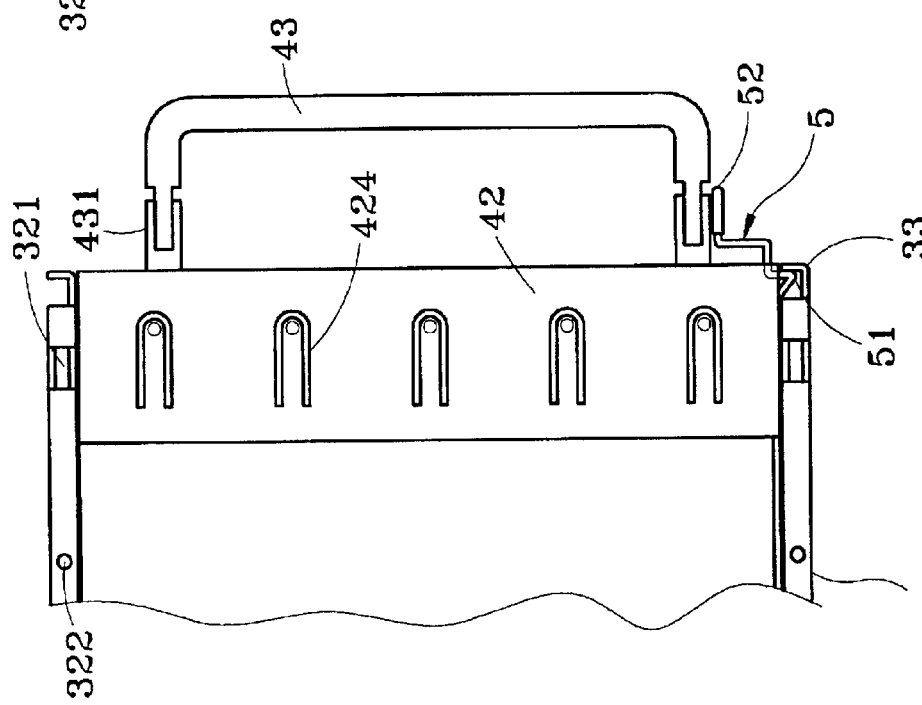
Figure 3A:
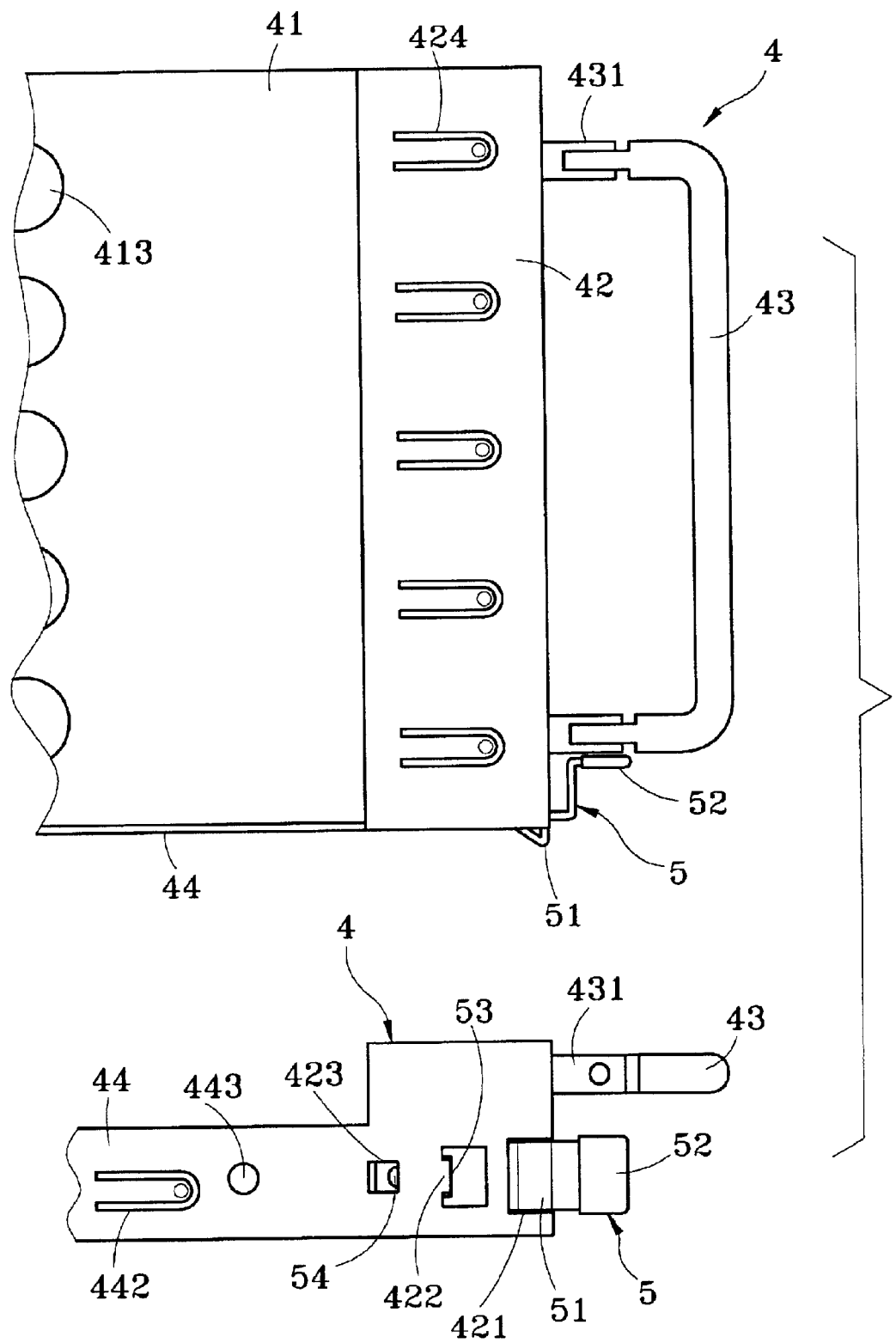
FIGS. 3A and 3B are schematic views of a handle and brake elastic strip in use.
Figure 3B:
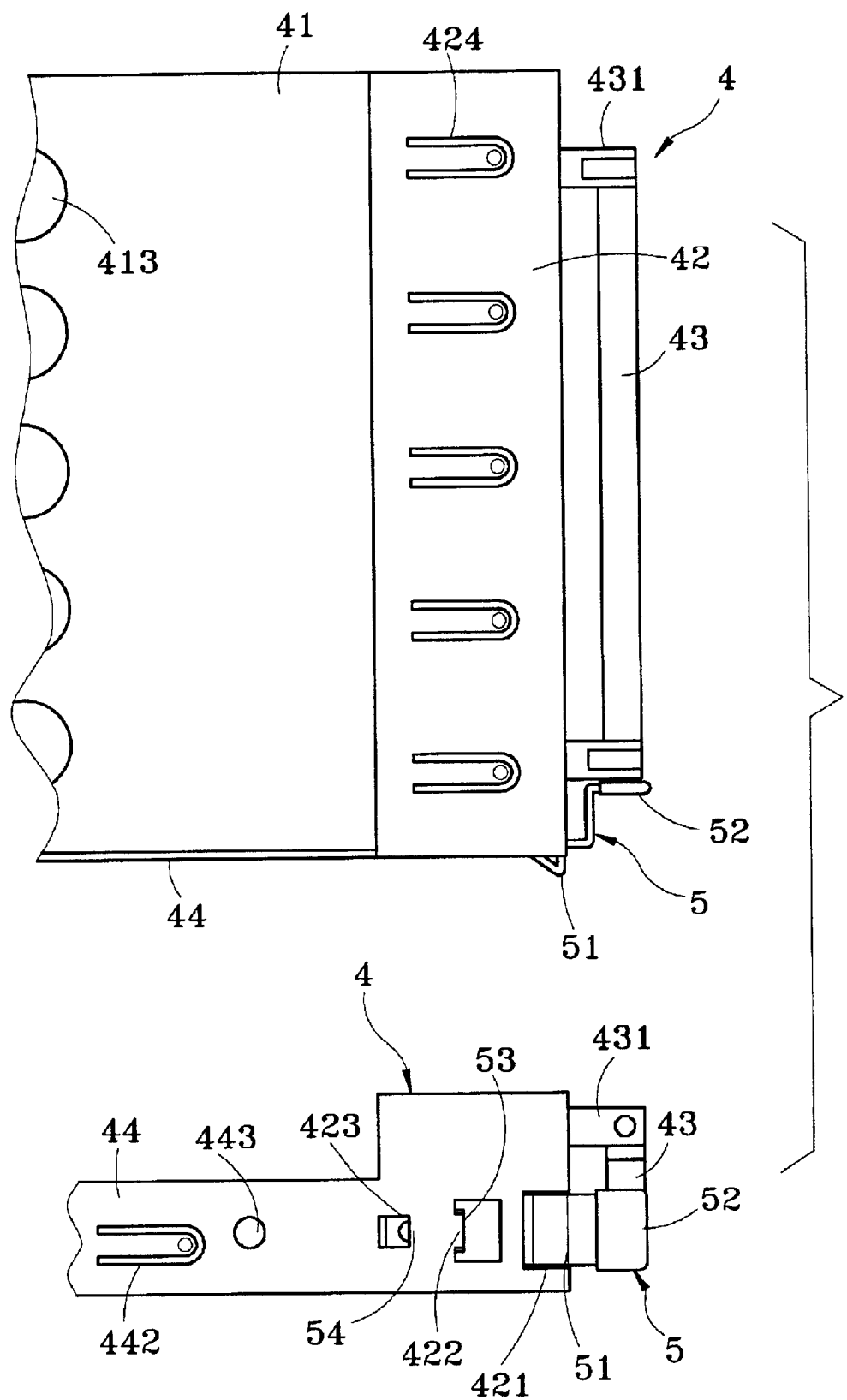

Referring to FIGS. 2A and 2B, when in use, the retrieval cradle 4 may be removed from the server, then hard disk drive 6 may be mounted and fastened to the retrieval cradle 4 by engaging screws through the fasten apertures 412 and 443 formed on the displacement board 41 and side board 44 with screw holes 61. 61' located on the side wall and bottom wall of the hard disk drive 6. Then through the handle 43, the retrieval cradle 4 may be pushed into the retrieval chamber 12 bordered by the main partition 2 and secondary partitions 3. When the retrieval cradle 4 is completely housed in the casing 1, the jutting section 51 of the brake elastic strip 5 will be latched in the retain section 33 located at the front end of the secondary partition 3 to prevent the retrieval cradle 4 from sliding out. Referring to FIGS. 3A and 3B, when the retrieval cradle 4 is housed in the casing 1, the handle 43 may be dropped downwards beside the depressing section 52 of the brake elastic strip 5 so that the depressing section 52 cannot be moved sidewards to release the braking thereby can prevent the retrieval cradle 4 from moving out incidentally. When there is a need to replace the hard disk drive 6, users may lift the handle 43 with a hand and to depress the depressing section 52 with a thumb to disengage the jutting section 51 from the retain section 33, then pull the handle 43 to move the retrieval cradle 4 away from the retrieval chamber 12 for replacing the hard disk drive 6.

Figure 4:
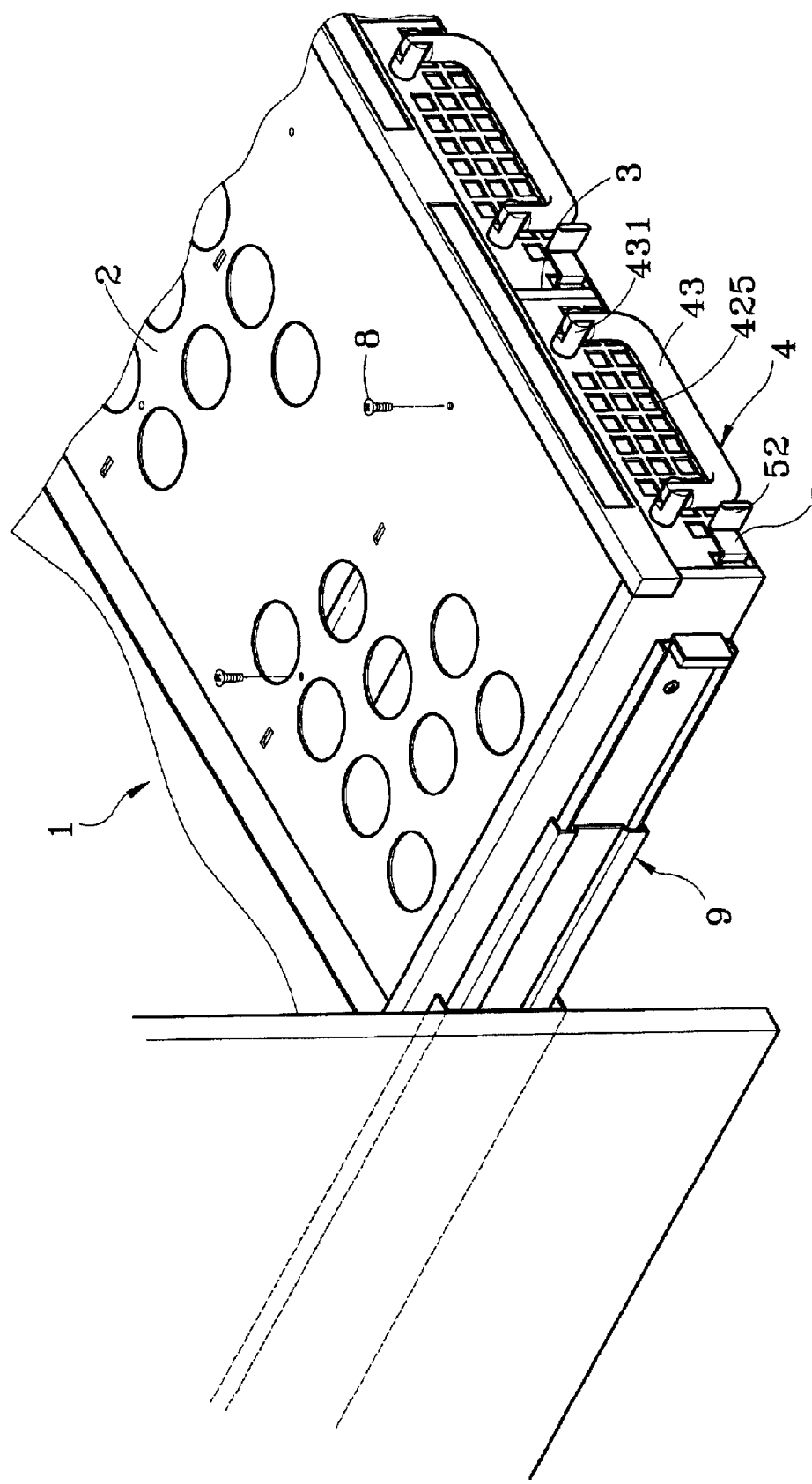
FIG. 4 is a schematic view of the invention in use.

Referring to FIG. 4, four sets of hard disk drives 6 may be housed in the 1U casing in a juxtaposed manner. Hence the standard 1U server with a width of 17 inches may have standard 10 mm steel ball slide rails installed on two sides of the server without the need of using smaller and specially made slide rails. And consumers do not need to purchase additional facilities.

Furthermore, the retrieval chambers 12 formed by the main partition 2 and secondary partitions 3 in the server not only can house four sets of retrieval hard disk drives 6, they can also make better utilization of the height such as mounting super thin floppy disk drives and optical disk drives (not shown in the drawings) on the main partition 2 for portable computers to achieve full function.

What is claimed is:

1. A server contained four juxtapose hard disk drives having four juxtaposed standard 3.5 inches hard disk drives housed in a server which is conformed to 1U 19 inches specifications, comprising:

a casing having a main partition, a bottom board and three secondary partitions located between the main partition and the bottom board to form four retrieval chambers for housing the four hard disk drives, each retrieval chamber containing a retrieval cradle which has a displacement board, an anchor rack located at a front end of the displacement board and a side board located on one side of the displacement board, the anchor rack having a handle mounted thereon for retrieving the retrieval cradle, the displacement board and the side board having respectively a plurality of fasten apertures formed thereon to fasten the hard disk drives such that the four standard 3.5 inches hard disk drives are allowed to house in the server conformed to 1U 19 inches specifications in a juxtaposed manner and are retrievable through the retrieval cradles, the bottom board has a stopping ridge corresponding to a rear end of the secondary partition for confining the secondary partition at a selected location.

2. The server contained four juxtapose hard disk drives of claim 1, wherein the main partition is selectively a lid of the casing or a dividing partition located in the casing.

3. The server contained four juxtapose hard disk drives of claim 1, wherein the secondary partition has a bottom end formed a first anchor section for fastening to the bottom board of the casing, the first anchor section having a first latch slot to engage with a first latch element located on the bottom board.

4. The server contained four juxtapose hard disk drives of claim 1, wherein the secondary partition has a top end formed a second anchor section for fastening to the main partition, the second anchor section having a second latch slot to engage with a second latch element located on the main partition.

5. The server contained four juxtapose hard disk drives of claim 1, wherein the anchor rack of the retrieval cradle has a jutting strut pivotally engaged with the handle.

6. The server contained four juxtapose hard disk drives of claim 1 further having a brake elastic strip located between one side of the anchor rack and a retain section located on a front end of the secondary partition to form a braking relationship therebetween, the brake elastic strip having a jutting section, a depressing section formed at a front free end thereof, a latch bore and an anchor section, the anchor rack having an opening formed on one side thereof to allow the brake elastic strip to pass through, and a latch lug and an anchor bore to engage respectively with the latch bore and the anchor section, the jutting section of the brake elastic strip being engageable with the retain section of the secondary partition.

7. The server contained four juxtapose hard disk drives of claim 1, wherein the displacement board of the retrieval cradle and the anchor rack have respectively a plurality of heat radiating openings.

8. The server contained four juxtapose hard disk drives of claim 1, wherein the anchor rack of the retrieval cradle and the side board adjacent to the casing have respectively a plurality of conductive strips to connect a server cabinet for preventing static charge.

9. The server contained four juxtapose hard disk drives of claim 3, wherein the second anchor section has a free end formed a reinforced section.

10. The server contained four juxtapose hard disk drives of claim 4, wherein the second anchor section and the main partition have respectively first fasten apertures and second fasten apertures corresponding with one another to engage with fasten elements for anchoring the secondary partition.

11. A server contained four juxtapose hard disk drives having four juxtaposed standard 3.5 inches hard disk drives housed in a server which is confirmed to 1U 19 inches specifications, comprising:

a casing having a main partition, a bottom board and three secondary partitions located between the main partition and the bottom board to form four retrieval chambers for housing the four hard disk drives, each retrieval chamber containing a retrieval cradle which has a displacement board, an anchor rack located at a front end of the displacement board and a side board located on one side of the displacement board, the anchor rack having a handle mounted thereon for retrieving the retrieval cradle, the displacement board and the side board having respectively a plurality of fasten apertures formed thereon to fasten the hard disk drives such that the four standard 3.5 inches hard disk drives are allowed to house in the server conformed to 1U 19 inches specifications in a juxtaposed manner and are retrievable through the retrieval cradles, further having a brake elastic strip located between one side of the anchor rack and a retain section located on a front end of the secondary partition to form a braking relationship therebetween, the brake elastic strip having a jutting section, a depressing section formed at a front free end thereof, a latch bore and an anchor section, the anchor rack having an opening formed on one side thereof to allow the brake elastic strip to pass through, and a latch lug and an anchor bore to engage respectively with the latch bore and the anchor section, the jutting section of the brake elastic strip being engageable with the retain section of the secondary partition.

12. The server contained four juxtapose hard disk drives of claim 11, wherein the secondary partition has a bottom end formed a first anchor section for fastening to the bottom board of the casing, the first anchor section having a first latch slot to engage with a first latch element located on the bottom board.

13. The server contained four juxtapose hard disk drives of claim 11, wherein the secondary partition has a top end formed a second anchor section for fastening to the main partition, the second anchor section having a second latch slot to engage with a second latch element located on the main partition.

14. The server contained four juxtapose hard disk drives of claim 12, wherein the second anchor section has a free end formed a reinforced section.

15. The server contained four juxtapose hard disk drives of claim 13, wherein the second anchor section and the main partition have respectively first fasten apertures and second fasten apertures corresponding with one another to engage with fasten elements for anchoring the secondary partition.

* * * * *